(12) United States Patent
Yoo

(10) Patent No.: US 10,177,733 B2
(45) Date of Patent: Jan. 8, 2019

(54) MEMS RESONATOR

(71) Applicant: Hyundai Motor Company, Seoul (KR)

(72) Inventor: Ilseon Yoo, Suwon-Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 322 days.

(21) Appl. No.: 15/152,866

(22) Filed: May 12, 2016

(65) Prior Publication Data

US 2017/0170802 A1    Jun. 15, 2017

(30) Foreign Application Priority Data

Dec. 11, 2015 (KR) .................. 10-2015-0177465

(51) Int. Cl.
*H03H 9/24* (2006.01)
*H03H 9/125* (2006.01)
(Continued)

(52) U.S. Cl.
CPC ....... *H03H 9/02244* (2013.01); *B81B 3/0021* (2013.01); *G01C 19/5719* (2013.01); *G01P 15/097* (2013.01); *H03H 9/02275* (2013.01); *H03H 9/02393* (2013.01); *H03H 9/02409* (2013.01); *H03H 9/2447* (2013.01); *B81B 2201/0271* (2013.01); *B81B 2203/0118* (2013.01); *B81B 2203/0136* (2013.01);
(Continued)

(58) Field of Classification Search
CPC .......... H03H 9/02244; H03H 9/02275; H03H 9/02338; H03H 9/02393; H03H 9/02409; H03H 2009/02165; H03H 2009/02291; H03H 9/2405; H03H 9/2447; H03H 9/2457; H03H 9/467; B81B 3/0021; B81B 2201/0271; B81B 2203/0118; B81B 2203/0136; B81B 2207/015; G01C 19/5719; G01P 15/097
USPC .................................................. 333/186, 188
See application file for complete search history.

(56) References Cited

U.S. PATENT DOCUMENTS 5,491,604 A * 2/1996 Nguyen ............. G01R 33/0286
331/116 M
5,640,133 A * 6/1997 MacDonald ........... H02N 1/008
333/186
(Continued)

FOREIGN PATENT DOCUMENTS

JP          5101410 B2    12/2012
KR    10-2010-0083582      7/2010
(Continued)

*Primary Examiner* — Barbara Summons
(74) *Attorney, Agent, or Firm* — Mintz Levin Cohn Ferris Glovsky and Popeo, P.C.; Peter F. Corless

(57) ABSTRACT

A MEMS resonator includes a main substrate forming a receiving part at a center of the main substrate; a mass body having one end part and a center part elastically supported by both sides of the main substrate; a driving unit configured at one side of the receiving part on the main substrate and producing a driving force by a voltage applied to both sides of the one end part of the mass body to move a position of the mass body with respect to the main substrate; and a tuning part including a pair of tuning units provided symmetrically with respect to the second elastic member, and having a beam member changing a length of the second elastic member by an actuating operation of each tuning unit to control a frequency.

10 Claims, 3 Drawing Sheets

(51) Int. Cl.
  *H03H 9/02* (2006.01)
  *B81B 3/00* (2006.01)
  *G01C 19/5719* (2012.01)
  *G01P 15/097* (2006.01)

(52) U.S. Cl.
  CPC .......... *B81B 2207/015* (2013.01); *H03H 2009/02165* (2013.01); *H03H 2009/02291* (2013.01)

(56) References Cited

U.S. PATENT DOCUMENTS

| | | | | |
|---|---|---|---|---|
| 5,914,553 | A * | 6/1999 | Adams | G01P 1/006 310/309 |
| 6,628,039 | B2 * | 9/2003 | Dhuler | H01H 1/0036 310/306 |
| 6,954,020 | B2 * | 10/2005 | Ma | H03H 9/24 310/309 |
| 8,436,698 | B2 * | 5/2013 | Rogers | H01G 5/145 257/312 |
| 8,633,635 | B1 * | 1/2014 | Pan | H03H 9/2405 310/306 |
| 2003/0037615 | A1 | 2/2003 | Madaras et al. | |
| 2006/0291794 | A1 * | 12/2006 | Liu | G02B 6/266 385/140 |
| 2011/0198202 | A1 * | 8/2011 | Rogers | B81B 3/0054 200/181 |
| 2016/0308507 | A1 * | 10/2016 | Engelen | H02N 11/00 |

FOREIGN PATENT DOCUMENTS

| | | |
|---|---|---|
| KR | 10-2010-0096665 A | 9/2010 |
| KR | 10-1000642 | 12/2010 |
| KR | 10-2012-0039645 | 4/2012 |
| KR | 10-1239636 | 3/2013 |

* cited by examiner

MEMS RESONATOR

CROSS-REFERENCE TO RELATED APPLICATION

This application claims under 35 U.S.C. § 119(a) the benefit of Korean Patent Application No. 10-2015-0177465 filed in the Korean Intellectual Property Office on Dec. 11, 2015, the entire contents of which are incorporated herein by reference.

BACKGROUND (a) Field of the Invention

The present invention relates to a MEMS resonator, more particularly, to a MEMS resonator maintaining a tuning state without an ongoing application of voltage through a method of controlling rigidity to tune a resonance frequency when a voltage is applied to an actuator to artificially restrain a spring supporting a mass body.

(b) Description of the Related Art

In general, a MEMS (Micro-Electro-Mechanical System) technology is used to make micro mechanical structures, such as ultra-high-density integrated circuits, by processing silicon, crystal, or glass.

The MEMS technology that started through silicon processing techniques can realize mass production of an ultra-small-sized product at low cost by applying semiconductor fine processing technology for structurally repeating processes such as deposition and etching, such that size, cost, and power consumption can be significantly reduced.

Particularly, the MEMS resonator is widely used in various fields such as an acceleration system, an inertial sensor such as an angular speed system, an RF filter, a mass detecting sensor, and a microlens scanner.

This MEMS resonator consists of a mass body, a spring, and a damper, and detects conversion coefficients due to a physical amount input from an outside such as amplitude of the mass body and a resonance frequency, that is, resonance characteristics.

However, the MEMS resonator is defective when its own frequency is changed due to errors or operation environments of a manufacturing process, that is, changes of an external temperature or pressure.

However, an existing method of tuning the frequency is complicated and costly, and in the electrical tuning type, there is a drawback that an ongoing application voltage is required.

The above information disclosed in this Background section is only for enhancement of understanding of the background of the invention and therefore it may contain information that does not form the prior art that is already known in this country to a person of ordinary skill in the art.

SUMMARY

A MEMS resonator is configured to tune a resonance frequency by controlling rigidity as a spring connected to a mass body is restrained by applying a voltage to an actuator and maintain a tuning state by a frictional force of a carbon nanotube (CNT) even if the voltage is removed after the tuning is completed.

In one or a plurality of exemplary embodiments of the present invention, a MEMS resonator includes: a main substrate forming a receiving part at a center of the main substrate; a mass body positioned at a center of the receiving part on the main substrate and having one end part and a center part elastically supported at both sides of the main substrate through a first elastic member and a second elastic member; a driving unit configured at one side of the receiving part on the main substrate and producing a driving force by a voltage applied to both sides of the one end part of the mass body to move a position of the mass body with respect to the main substrate; and a tuning part including a pair of tuning units provided symmetrically as a pair with respect to the second elastic member, respectively configured at the receiving part by corresponding to both sides of the center part of the mass body, and having a beam member changing a length of the second elastic member by an actuating operation of each tuning unit to control a frequency.

The tuning unit may include: an auxiliary substrate configured inside the receiving part of the main substrate by corresponding to the center part of the mass body; a first actuator configured in the receiving part between the auxiliary substrate and the main substrate and driving each contact end positioned at both sides with respect to a shuttle positioned at the center of the receiving part depending on an application voltage to control a movement of the shuttle; a second actuator positioned at a rear part of the first actuator in the opposite side of the second elastic member and configured with a driving beam on a plurality of heating lines extending by an application voltage act on the rear end of the shuttle; and a beam member positioned to enable contact with the second elastic member inside the receiving part between the auxiliary substrate and the main substrate and fixed to a front end of the shuttle.

The front end part of the shuttle may be connected to a third elastic member disposed between the auxiliary substrate and the main substrate.

The first actuator may include a shuttle positioned at the center of the receiving part between the auxiliary substrate and the main substrate, may be disposed respectively corresponding to the auxiliary substrate and the main substrate at both sides of the shuttle to form a contact end contacting the shuttle at each inner end, and may have a deformation part made of a first beam and a second beam connected to an electrode from the contact end.

The first beam may be disposed at both sides corresponding to the shuttle, the second beam may be formed with the same thickness outside the first beam at the opposite side of the contact end, and the second beam may be shorter than the first beam.

Each contact end of the first actuator and the shuttle corresponding to the contact end may be coated with carbon nanotube (CNT).

In the second actuator, the plurality of heating lines may be integrally connected on both ends by a supporting end, a driving beam may be configured at the center part of each heating line, and the driving beam may contact the rear end of the shuttle by an extending change amount of each heating line to drive the shuttle.

The beam member may be formed with a curved surface of an oval shape.

The main substrate may be a silicon-on-insulator (SOI) substrate.

The driving unit may be made as a comb finger driver.

An exemplary embodiment of the present invention applies the voltage to the second actuator to move the shuttle contacting the contact end of the first actuator to the side of the spring connected to the mass body, thereby constraining the spring and controlling the rigidity thereof, and accordingly, through the method of tuning the resonance frequency, the tuning state may be maintained by the frictional force of the CNT coated on the contact end even if the supply of the voltage is removed, such that there is a very beneficial effect in terms of power consumption.

Further, effects that can be obtained or expected from exemplary embodiments of the present invention are directly or suggestively described in the following detailed description. That is, various effects expected from exemplary embodiments of the present invention will be described in the following detailed description.

DETAILED DESCRIPTION OF THE EMBODIMENTS

Figure 1:
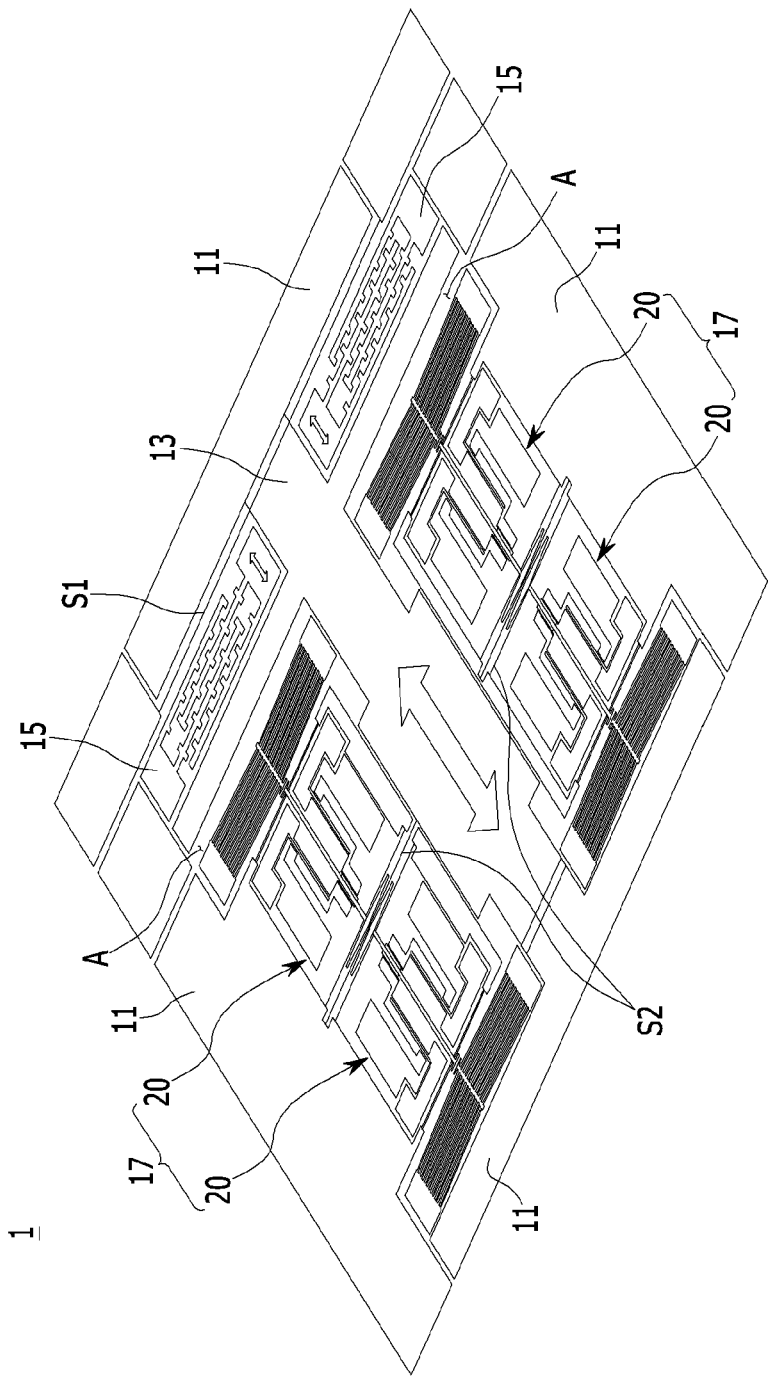
FIG. 1 is a cross-sectional view of a MEMS resonator according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, exemplary embodiments of the present invention will be described with reference to the accompanying drawings. However, drawings and a detailed description to be described later relate to an exemplary embodiment of several exemplary embodiments for effectively describing a characteristic of the present invention. Therefore, the present invention is not limited to only the following drawing and description.

Figure 2:
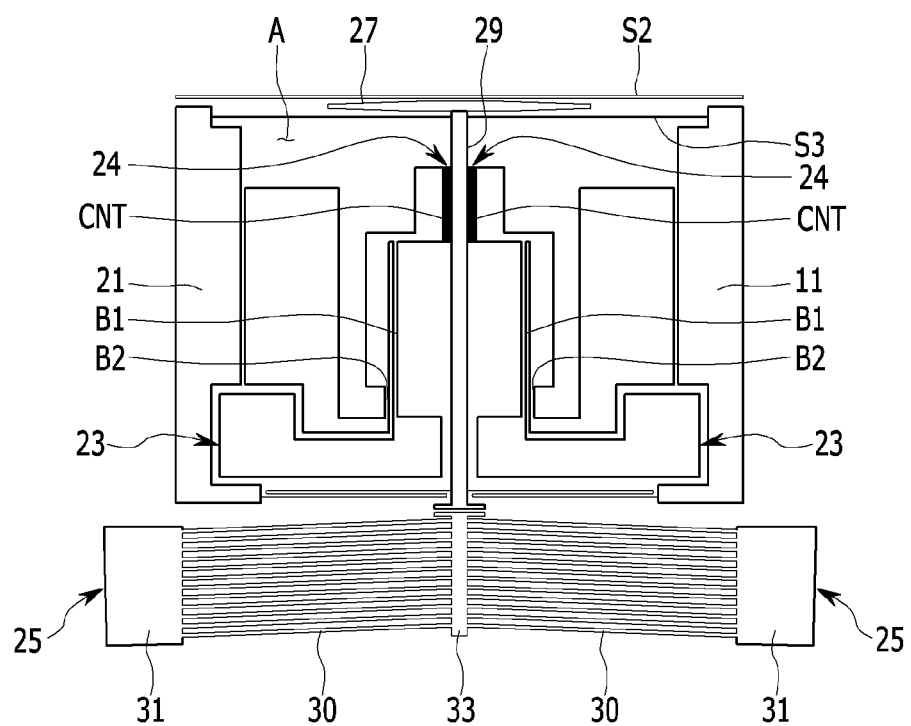
FIG. 2 is an enlarged cross-sectional view of a tuning unit of a MEMS resonator according to an exemplary embodiment of the present invention.

FIG. 1 is a cross-sectional view of a MEMS resonator according to an exemplary embodiment of the present invention, and FIG. 2 is an enlarged cross-sectional view of a tuning unit of a MEMS resonator according to an exemplary embodiment of the present invention.

Referring to FIG. 1, the MEMS resonator 1 according to an exemplary embodiment of the present invention includes a main substrate 11, a mass body 13, a driving unit 15, and a tuning part 17.

First, the main substrate 11 forms a receiving part A at the center.

In this case, the main substrate 11 is made of an SOI (silicon-on-insulator) substrate.

The SOI substrate refers to a substrate in which a buried insulating layer is laminated between an underlying supporting substrate and the main substrate 11 in a sandwich structure. The SOI substrate is configured to form complete element separation.

Also, the mass body 13 is positioned at the center of the receiving part A on the main substrate 11. The mass body 13 has one end part that is elastically supported through the first elastic member S1 on the main substrate 11, and a center part that is elastically supported through the second elastic member S2.

Also, the driving unit 15 is disposed at one side of the receiving part A on the main substrate 11. The driving unit 15 includes two drivers facing each other, and is configured to have a translational movement with respect to one direction by applying an AC voltage to the two drivers. Accordingly, the mass body 13 is driven due to the translation of the driving unit 15. The driving unit 15 is made of a comb finger driver.

The tuning part 17 includes four tuning units 20 in the receiving part A on the main substrate 11. That is, in the tuning part 17, the tuning units 20 are symmetrical as pairs with respect to the second elastic member S2, and are respectively configured corresponding to both sides of the center part of the mass body 13.

The tuning part 17 intentionally restrains the second elastic member S2 by the actuating operation of each tuning unit 20 to change the rigidity thereof, thereby controlling the frequency. Referring to FIG. 2, the tuning unit 20 includes an auxiliary substrate 21, a first actuator 23, a second actuator 25, and a beam member 27.

The auxiliary substrate 21 is disposed corresponding to the center part of the mass body 13 inside the receiving part A of the main substrate 11. Also, the first actuator 23 is disposed in the receiving part A between the main substrate 11 and the auxiliary substrate 21. The first actuator 23 includes a shuttle 29 positioned at the center of the receiving part A between the main substrate 11 and the auxiliary substrate 21.

In this case, the front end of the shuttle 29 is connected to the third elastic member S3 disposed between the main substrate 11 and the auxiliary substrate 21.

Also, the first actuator 23 is respectively disposed to correspond to the main substrate 11 and the auxiliary substrate 21 at both sides of the shuttle 29 and a contact end 24 that contacts the shuttle 29 at each inner end.

Here, the contact end 24 of the first actuator 23 and the shuttle 29 corresponding to the contact end 24 are coated with CNT (carbon nanotubes).

The CNT uses a chemical vapor deposition (CVD) method by iron (Fe) as a catalyst, and is synthesized by injecting ammonia (NH3) gas and acetylene (C2H2) gas at about 700° C. The CNT may be grown to approximately 10 µm.

The first actuator 23 has a deformation part made of a first beam B1 and a second beam B2 connected to the electrode from the contact end. The first beam B1 is disposed at both sides corresponding to the shuttle 29, and the second beam B2 is formed with the same thickness at the outside of the first beam B1 at the opposite side of the contact end 24. In this case, the second beam B2 has a shorter length than the first beam B1.

The first actuator 23 drives each contact end 24 positioned at both sides with respect to the shuttle 29 positioned at the center depending on the input application voltage, thereby controlling the movement of the shuttle 29.

The second actuator 25 is located at the rear part of the first actuator 23 at the opposite side of the second elastic member S2. The second actuator 25 is configured with a plurality of heating lines 30 extending by the application of a voltage to act on the rear end of the shuttle 29.

In this case, the plurality of heating lines 30 are integrally connected by a supporting end 31 through both ends and a driving beam 33 is configured at the center.

As the driving beam 33 contacts the rear end of the shuttle 29 by the extending change amount of each heating line 30, the second actuator 25 drives the shuttle 29.

The above-described second actuator 25 may be a chevron thermal actuator.

Also, the beam member 27 is positioned to enable it to contact the second elastic member S2 inside the receiving part A between the main substrate 11 and the auxiliary substrate 21. The beam member 27 is formed into a curved surface of an oval shape to be fixed to the front end of the shuttle 29. For example, the beam member 27 may be made of a bow-shaped beam.

Figure 3:
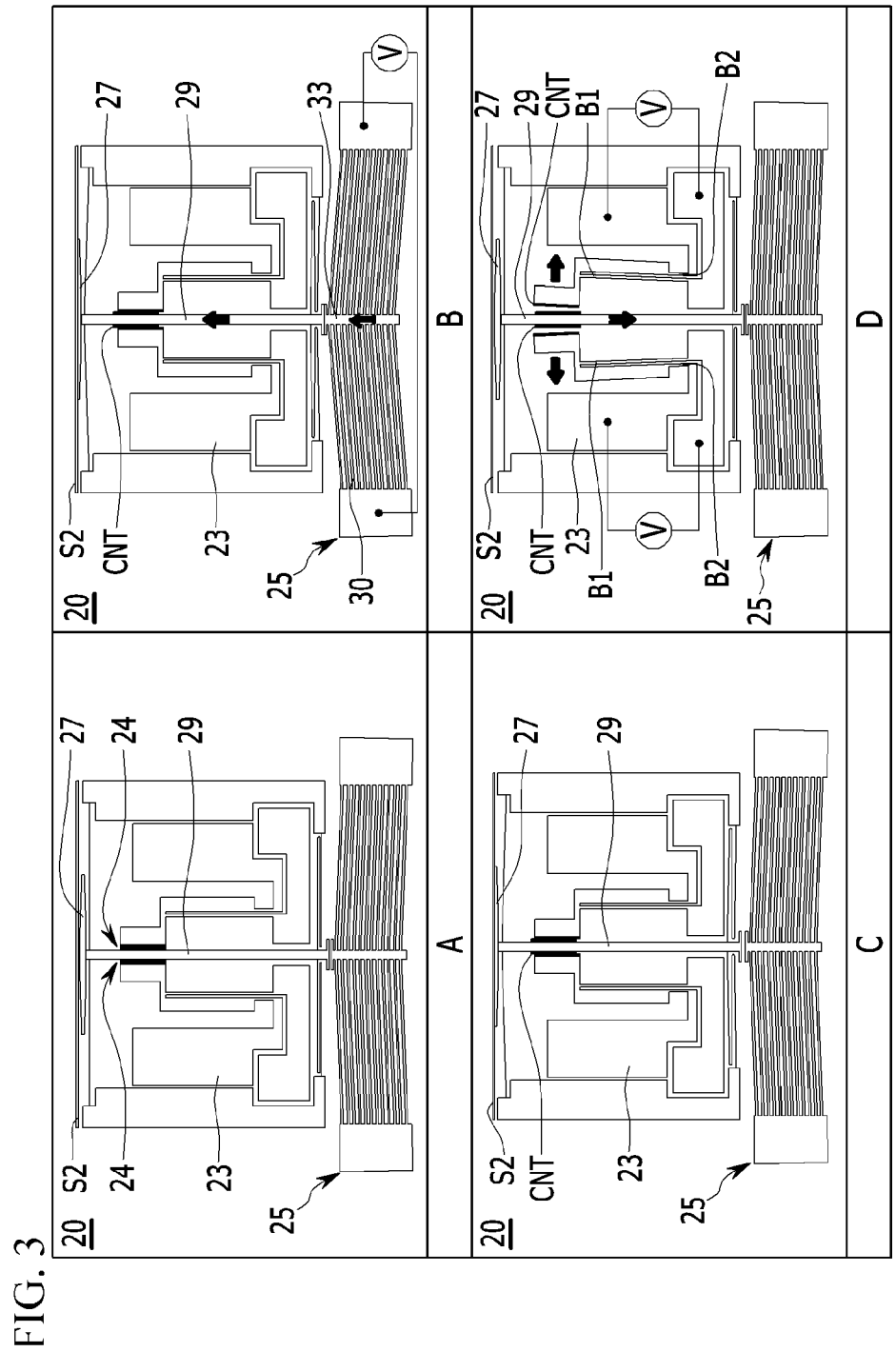
FIG. 3 is an operation diagram explaining a tuning unit of a MEMS resonator according to an exemplary embodiment of the present invention.

FIG. 3 is an operation diagram explaining a tuning unit of a MEMS resonator according to an exemplary embodiment of the present invention.

FIG. 3 (A) shows an initial state of the tuning unit 20, and the shuttle 29 positioned at the center of the first actuator 23 is in contact with the contact end 24 and is connected to the beam member 27 of the front end. In this case, the beam member 27 maintains separation from the second elastic member S2.

Referring to FIG. 3 (B), the voltage is applied to the second actuator 25 of the tuning unit 20. In this case, the plurality of heating lines 30 formed in the second actuator 25 extend to be deformed such that the driving beam 33 positioned at the center of the heating line 30 contacts the rear end of the shuttle 29 positioned at the center of the first actuator 23, and the shuttle 29 is moved to the side of the second elastic member S2.

That is, while the beam member 27 with the oval shape fixed to the front end of the shuttle 29 contacts the second elastic member S2 and shrinks, as the length of the second elastic member S2 is changed and the rigidity is changed, the movement of the mass body 13 connected to the second elastic member S2 is controlled such that the frequency is tuned.

Referring to FIG. 3(C), in the state that the beam member 27 is in contact with the second elastic member S2, even if the voltage applied to the second actuator 25 is removed, the shuttle 29 maintains its position by the frictional force with each contact end 24 of the first actuator 23 positioned at both sides of the shuttle 29. The position of the shuttle 29 is maintained by the frictional force of the CNT coated between the shuttle 29 and the contact end 24 contacting thereto.

Referring to FIG. 3(D), in order to return the shuttle 29 to the original position after tuning the frequency, the voltage is applied to the first actuator 23. Thus, while the first actuators 23 are separated to both sides of the shuttle 29 by the deformation length difference of the first beam B1 and the second beam B2 of each deformation part, the contact end 24 formed at the front end of each deformation part is separated from the shuttle 29 and the mutual frictional force by the CNT is removed, and resultantly, the shuttle 29 is returned to the original position by using the elastic force of the second elastic member S2.

In this case, the deformation part is formed of the structure in which the second beam B2 having the shorter length than the first beam B1 is disposed outside the first beam B1, and accordingly, the deformation is induced in the shape such that the first actuators 23 are inclined outside by the first beam B1 having the relatively longer length.

Accordingly, while the shuttle 29 that has restricted the second elastic member S2 is restored to the original position, the tuning part 17 is returned to the initial state.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A MEMS resonator, comprising:
   a main substrate forming a receiving part at a center of the main substrate;
   a mass body positioned at a center of the receiving part on the main substrate and having one end part and a center part elastically supported by both sides of the main substrate through a first elastic member and a second elastic member;
   a driving unit configured at one side of the receiving part on the main substrate and producing a driving force by a voltage applied to both sides of the one end part of the mass body to move a position of the mass body with respect to the main substrate; and
   a tuning part including a pair of tuning units provided symmetrically with respect to the second elastic member, respectively configured at the receiving part by corresponding to both sides of the center part of the mass body, and having a beam member changing a length of the second elastic member by an actuating operation of each of the pair of tuning units to control a frequency.

2. The MEMS resonator of claim 1, wherein each of the pair of tuning units includes:
   an auxiliary substrate configured inside the receiving part of the main substrate by corresponding to the center part of the mass body;

a first actuator configured in the receiving part between the auxiliary substrate and the main substrate and driving each of contact ends of the first actuator positioned at both sides with respect to a shuttle positioned at the center of the receiving part depending on an application voltage to control a movement of the shuttle; and a second actuator positioned at a rear part of the first actuator in the opposite side of the second elastic member and configured with a driving beam on a plurality of heating lines extending by an application voltage to act on the rear end of the shuttle, wherein the beam member is positioned to enable contact with the second elastic member inside the receiving part between the auxiliary substrate and the main substrate and is fixed to a front end of the shuttle.

3. The MEMS resonator of claim 2, wherein in the shuttle, the front end part is connected to a third elastic member disposed between the auxiliary substrate and the main substrate.

4. The MEMS resonator of claim 2, wherein the first actuator includes the shuttle positioned at the center of the receiving part between the auxiliary substrate and the main substrate, is disposed respectively corresponding to the auxiliary substrate and the main substrate at both sides of the shuttle to form each of the contact ends contacting the shuttle at each inner end, and has a deformation part made of a first beam and a second beam connected to respective electrodes to which a voltage may be applied to deform each of the contact ends and release each inner end from contacting the shuttle.

5. The MEMS resonator of claim 4, wherein the first beam is disposed at both sides corresponding to the shuttle, the second beam is formed with the same thickness outside the first beam at the opposite side of each of the contact ends, and the second beam is shorter than the first beam.

6. The MEMS resonator of claim 2, wherein each of the contact ends of the first actuator and the shuttle corresponding to the contact ends is coated with carbon nanotubes (CNTs).

7. The MEMS resonator of claim 2, wherein in the second actuator, the plurality of heating lines are integrally connected on both ends by a supporting end, a driving beam is configured at the center part of each heating line, and the driving beam contacts the rear end of the shuttle by an extending change amount of each heating line to drive the shuttle.

8. The MEMS resonator of claim 2, wherein the beam member is formed with a curved surface of an oval shape.

9. The MEMS resonator of claim 1, wherein the main substrate is a silicon-on-insulator (SOI) substrate.

10. The MEMS resonator of claim 1, wherein the driving unit is made as a comb finger driver.

* * * * *